(12) United States Patent
Iwamoto

(10) Patent No.: US 11,456,719 B2
(45) Date of Patent: Sep. 27, 2022

(54) ACOUSTIC WAVE DEVICE

(71) Applicant: Murata Manufacturing Co., Ltd., Nagaokakyo (JP)

(72) Inventor: Hideki Iwamoto, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 297 days.

(21) Appl. No.: 16/888,945

(22) Filed: Jun. 1, 2020

(65) Prior Publication Data

US 2020/0389147 A1 Dec. 10, 2020

(30) Foreign Application Priority Data

Jun. 6, 2019 (JP) .............................. JP2019-106106

(51) Int. Cl.
*H03H 9/02* (2006.01)
*H03H 9/17* (2006.01)

(52) U.S. Cl.
CPC .... *H03H 9/02086* (2013.01); *H03H 9/02015* (2013.01); *H03H 9/02228* (2013.01); *H03H 9/17* (2013.01)

(58) Field of Classification Search
CPC .......... H03H 9/02086; H03H 9/02015; H03H 9/02228; H03H 9/17; H03H 9/02133; H03H 9/02149; H03H 9/02574; H03H 9/174; H03H 9/547
See application file for complete search history.

(56) References Cited

U.S. PATENT DOCUMENTS

2013/0285768 A1 10/2013 Watanabe et al.
2014/0152146 A1* 6/2014 Kimura .............. H03H 9/02228
29/25.35

FOREIGN PATENT DOCUMENTS

WO 2012/086639 A1 6/2012

* cited by examiner

*Primary Examiner* — Jeffrey M Shin
(74) *Attorney, Agent, or Firm* — Keating & Bennett, LLP

(57) ABSTRACT

An acoustic wave device includes a high-acoustic-velocity support substrate, a low-acoustic-velocity film provided on the high-acoustic-velocity support substrate, a piezoelectric layer provided on the low-acoustic-velocity film, and an IDT electrode provided on the piezoelectric layer. An acoustic velocity of a bulk wave propagating through the high-acoustic-velocity support substrate is higher than an acoustic velocity of an acoustic wave propagating through the piezoelectric layer. An acoustic velocity of a bulk wave propagating through the low-acoustic-velocity film is lower than an acoustic velocity of a bulk wave propagating through the piezoelectric layer. The low-acoustic-velocity film has a first portion and a second portion that is located closer to the high-acoustic-velocity support substrate than the first portion. The first and second portions include the same or similar materials. A density in the first portion of the low-acoustic-velocity film and a density in the second portion of that are different.

13 Claims, 2 Drawing Sheets

ACOUSTIC WAVE DEVICE

CROSS REFERENCE TO RELATED APPLICATIONS

This application claims the benefit of priority to Japanese Patent Application No. 2019-106106 filed on Jun. 6, 2019. The entire contents of this application are hereby incorporated herein by reference.

BACKGROUND OF THE INVENTION

1. Field of the Invention

The present invention relates to an acoustic wave device.

2. Description of the Related Art

An acoustic wave device has been widely used, for example, as a filter for a mobile phone. International Publication No. 2012/086639 discloses an example of an acoustic wave device. This acoustic wave device has a multilayer body in which a high-acoustic-velocity support substrate, a low-acoustic-velocity film, and a piezoelectric film are laminated in this order and an interdigital transducer (IDT) electrode provided on the piezoelectric film. Due to the multilayer body, a Q factor increases.

However, use of the acoustic wave device described in International Publication No. 2012/086639 as a filter may undesirably deteriorate filter characteristics due to an occurrence of spurious modes outside a pass band of the filter.

SUMMARY OF THE INVENTION

Preferred embodiments of the present invention provide acoustic wave devices that are each able to significantly reduce or prevent an occurrence of a spurious mode outside a pass band.

An acoustic wave device according to a preferred embodiment of the present invention includes a high-acoustic-velocity support substrate; a low-acoustic-velocity film provided on the high-acoustic-velocity support substrate; a piezoelectric layer provided on the low-acoustic-velocity film; and an IDT electrode provided on the piezoelectric layer, wherein an acoustic velocity of a bulk wave propagating through the high-acoustic-velocity support substrate is higher than an acoustic velocity of an acoustic wave propagating through the piezoelectric layer, an acoustic velocity of a bulk wave propagating through the low-acoustic-velocity film is lower than an acoustic velocity of a bulk wave propagating through the piezoelectric layer, the low-acoustic-velocity film has a first portion and a second portion that is located closer to the high-acoustic-velocity support substrate than the first portion, the first portion and the second portion include the same or similar materials, and $\rho_1$ and $\rho_2$ are different where $\rho_1$ is a density in the first portion of the low-acoustic-velocity film and $\rho_2$ is a density in the second portion of the low-acoustic-velocity film.

According to the acoustic wave devices according to preferred embodiments of the present invention, an occurrence of a spurious mode outside a pass band is able to be significantly reduced or prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention are described below with reference to the drawings.

The preferred embodiments below are illustrative, and an element in one preferred embodiment may be replaced or combined with an element in another preferred embodiment.

Figure 1:
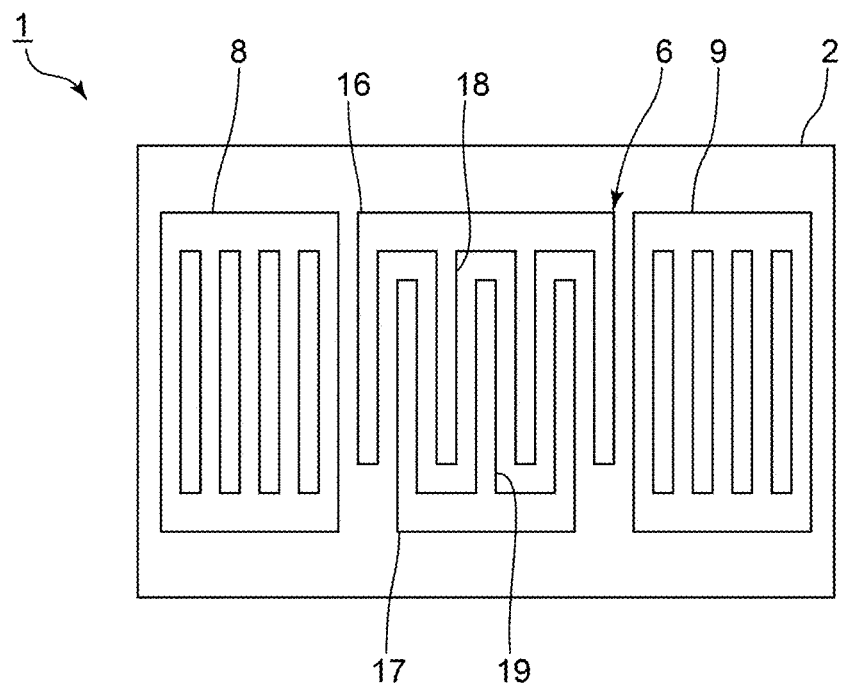
FIG. 1 is a plan view of an acoustic wave device according to a first preferred embodiment of the present invention.

FIG. 1 is a plan view of an acoustic wave device according to a first preferred embodiment of the present invention. In FIG. 1, a dielectric film, which will be described later, is omitted.

An acoustic wave device 1 includes a piezoelectric substrate 2. An IDT electrode 6 is provided on the piezoelectric substrate 2. An acoustic wave is excited by application of an alternating-current voltage to the IDT electrode 6. On the piezoelectric substrate 2, the IDT electrode 6 is sandwiched between a pair of reflectors 8 and 9 in a direction in which the acoustic wave propagates. That is, the acoustic wave device 1 according to the present preferred embodiment is an acoustic wave resonator. Note, however, that the acoustic wave device may be, for example, a filter device including an acoustic wave resonator.

Figure 2:
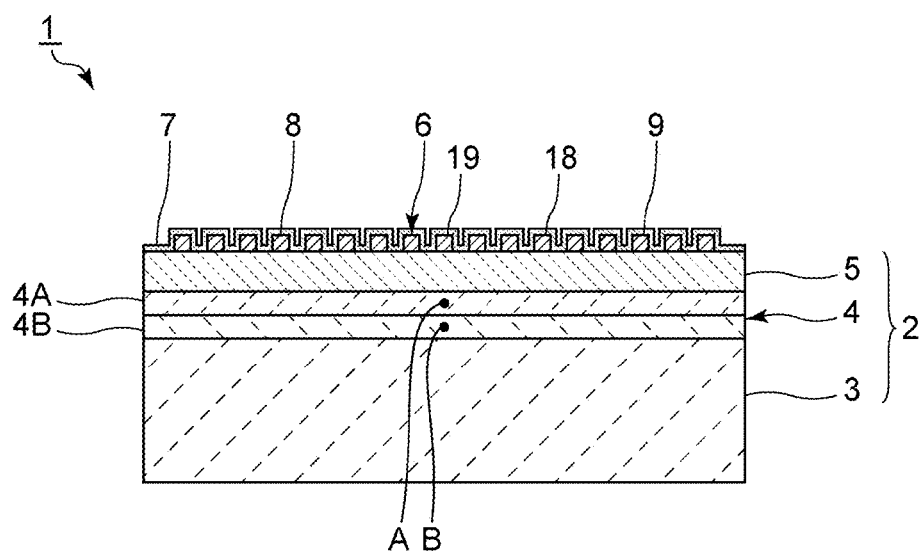
FIG. 2 is a front cross-sectional view of the acoustic wave device according to the first preferred embodiment of the present invention.

FIG. 2 is a front cross-sectional view of the acoustic wave device according to the first preferred embodiment.

The piezoelectric substrate 2 includes a high-acoustic-velocity support substrate 3, a low-acoustic-velocity film 4 provided on the high-acoustic-velocity support substrate 3, and a piezoelectric layer 5 provided on the low-acoustic-velocity film 4. The IDT electrode 6 is provided on the piezoelectric layer 5.

In the first preferred embodiment, the piezoelectric layer 5 is preferably a lithium tantalate layer, for example. A material of the piezoelectric layer 5 is not limited to lithium tantalate and may be, for example, a piezoelectric body such as, lithium niobate, zinc oxide, aluminum nitride, crystal, or PZT.

The low-acoustic-velocity film 4 is a film having a relatively low acoustic velocity. More specifically, an acoustic velocity of a bulk wave propagating through the low-acoustic-velocity film 4 is lower than an acoustic velocity of a bulk wave propagating through the piezoelectric layer 5. In the first preferred embodiment, the low-acoustic-velocity film 4 is preferably a silicon oxide film, for example. Silicon oxide is expressed by $SiO_x$, where x is any positive number. Note, however, that a material of the low-acoustic-velocity film 4 is not limited to silicon oxide.

The low-acoustic-velocity film 4 includes a first layer 4A and a second layer 4B located closer to the high-acoustic-velocity support substrate 3 than the first layer 4A. More specifically, the second layer 4B is laminated on the high-acoustic-velocity support substrate 3, and the first layer 4A is laminated on the second layer 4B. The low-acoustic-velocity film 4 includes a first portion A located in the first layer 4A and a second portion B located in the second layer 4B. The first portion A is located at a center or approximate center in a thickness direction of the first layer 4A. The second portion B is located at a center or approximate center in a thickness direction of the second layer 4B. Note, however, that the first portion A may be any portion of the first layer 4A and the second portion B may be any portion of the second layer 4B.

The first layer 4A and the second layer 4B of the low-acoustic-velocity film 4 are made of the same or similar materials. Accordingly, the first portion A and the second portion B are also made of the same or similar materials. The "same or similar materials" as used herein refer to materials that include the same or similar element. For example, in a case where the low-acoustic-velocity film 4 is a silicon oxide film as in the first preferred embodiment, the first layer 4A and the second layer 4B are made of the same or similar materials even if x of $SiO_x$ of the first layer 4A and x of $SiO_x$ of the second layer 4B are different.

In the first preferred embodiment, $\rho_1$ is preferably higher than $\rho_2$, where $\rho_1$ is a density in the first portion A of the low-acoustic-velocity film 4 and $\rho_2$ is a density in the second portion B of the low-acoustic-velocity film 4. However, it is only necessary that the density $\rho_1$ and the density $\rho_2$ are different. Therefore, $\rho_1$ may be lower than $\rho_2$. The density $\rho_1$ and the density $\rho_2$ are able to be made different from one another by forming the low-acoustic-velocity film 4, for example, at different film formation speeds or pressures.

The high-acoustic-velocity support substrate 3 is a substrate having a relatively high acoustic velocity. More specifically, an acoustic velocity of a bulk wave propagating through the high-acoustic-velocity support substrate 3 is higher than an acoustic velocity of an acoustic wave propagating through the piezoelectric layer 5. The high-acoustic-velocity support substrate 3 may be a medium mainly including a material, for example, aluminum oxide, silicon carbide, silicon nitride, silicon oxynitride, silicon, sapphire, lithium tantalate, lithium niobate, crystal, alumina, zirconia, cordierite, mullite, steatite, forsterite, magnesia, diamond-like carbon (DLC), or diamond.

Since the piezoelectric substrate 2 has a multilayer structure in which the high-acoustic-velocity support substrate 3, the low-acoustic-velocity film 4, and the piezoelectric layer 5 are laminated in this order, energy of an acoustic wave is able to be effectively confined on the piezoelectric layer 5 side. This multilayer structure of the piezoelectric substrate 2 is able to significantly increase a Q factor.

On the piezoelectric substrate 2, a dielectric film 7 covers the IDT electrode 6. In the first preferred embodiment, the dielectric film 7 is preferably a silicon oxide film, for example. A material of the dielectric film 7 is not limited to silicon oxide. Although the dielectric film 7 may be omitted, the dielectric film 7 is preferably provided to significantly reduce or prevent breaking of the IDT electrode 6.

As shown in FIG. 1, the IDT electrode 6 includes a first busbar 16 and a second busbar 17 that face each other. The IDT electrode 6 includes a plurality of first electrode fingers 18, each of which is connected to the first busbar 16 at one end thereof. Furthermore, the IDT electrode 6 includes a plurality of second electrode fingers 19, each of which is connected to the second busbar 17 at one end thereof. The plurality of first electrode fingers 18 and the plurality of second electrode fingers 19 interdigitate with each other.

The IDT electrode 6, the reflector 8, and the reflector 9 may be a multilayer metal film including a plurality of metal layers laminated on each other or may be a single-layer metal film.

The density $\rho_1$ in the first portion A and the density $\rho_2$ in the second portion B of the low-acoustic-velocity film 4 are different. More specifically, the density $\rho_1$ is preferably higher than the density $\rho_2$. This difference in density significantly reduces or prevents an occurrence of a spurious mode outside a pass band. This is described below through comparison between the first preferred embodiment and a comparative example. The comparative example is different from the first preferred embodiment in that $\rho_1$ is equal or substantially equal to $\rho_2$.

Simulation was performed on a phase characteristic of a higher-order mode by setting the density $\rho_1$ and the density $\rho_2$ to be different in an acoustic wave device according to the first preferred embodiment. More specifically, simulation was performed on a phase characteristic of a higher-order mode that occurs in a band that is approximately 1.5 times higher than a pass band of the acoustic wave device. Simulation was also performed on the phase characteristic of the higher-order mode in an acoustic wave device according to the comparative example. Design parameters of the acoustic wave devices are as follows. In the following description, λ represents a wave length defined by an electrode finger pitch of an IDT electrode. Hereinafter, for example, 0.01 λ is sometimes referred to as 1% λ.

high-acoustic-velocity support substrate: material . . . Si first layer of low-acoustic-velocity film: material . . . $SiO_2$, thickness . . . about 0.15 λ second layer of low-acoustic-velocity film: material . . . $SiO_2$, thickness . . . about 0.15 λ piezoelectric layer: material . . . $LiTaO_3$, thickness . . . about 0.3 λ

IDT electrode: material . . . Al, thickness . . . about 7% λ wave length of IDT electrode: about 2 μm duty of IDT electrode: about 0.5 dielectric film: material $SiO_2$, thickness about 2.5% λ

In the acoustic wave device according to the first preferred embodiment, the density $\rho_1$ of the low-acoustic-velocity film was changed within a range of not less than about 2.12 g/cm³ and not more than about 2.30 g/cm³, and the density $\rho_2$ of the low-acoustic-velocity film was changed within a range of not less than about 2.03 g/cm³ and not more than about 2.30 g/cm³. In the comparative example, the density $\rho_1$ and the density $\rho_2$ were changed within a range of not less than about 2.12 g/cm³ and not more than about 2.30 g/cm³.

Tables 1 to 3 show results of the first preferred embodiment and the comparative example. More specifically, Table 1 shows a result in a case where the density $\rho_1$ is about 2.21 g/cm³. Table 2 shows a result in a case where the density $\rho_1$ is about 2.12 g/cm³. Table 3 shows a result in a case where the density $\rho_1$ is about 2.30 g/cm³. An absolute value of a difference between the density $\rho_1$ and the density $\rho_2$ is |Δρ|, an average of the density $\rho_1$ and the density $\rho_2$ is $\rho_{ave}$, and a density difference ratio is |Δρ|/$\rho_{ave}$×100(%).

TABLE 1

| | density $\rho_1$ of low-acoustic-velocity film [g/cm$^3$] | density $\rho_2$ of low-acoustic-velocity film [g/cm$^3$] | average of densities $\rho_{ave}$ [g/cm$^3$] | density difference ratio $|\Delta\rho|/\rho_{ave} \times 100$ [%] | phase of higher-order mode [deg.] |
|---|---|---|---|---|---|
| comparative example | 2.21 | 2.21 | 2.21 | 0.00 | −67.0 |
| first preferred embodiment | 2.21 | 2.12 | 2.17 | 4.16 | −68.4 |
| | 2.21 | 2.03 | 2.12 | 8.49 | −69.7 |

TABLE 2

| | density $\rho_1$ of low-acoustic-velocity film [g/cm$^3$] | density $\rho_2$ of low-acoustic-velocity film [g/cm$^3$] | average of densities $\rho_{ave}$ [g/cm$^3$] | density difference ratio $|\Delta\rho|/\rho_{ave} \times 100$ [%] | phase of higher-order mode [deg.] |
|---|---|---|---|---|---|
| comparative example | 2.12 | 2.12 | 2.12 | 0.00 | −67.4 |
| first preferred embodiment | 2.12 | 2.08 | 2.10 | 1.90 | −68.0 |
| | 2.12 | 2.03 | 2.08 | 4.34 | −68.7 |

TABLE 3

| | density $\rho_1$ of low-acoustic-velocity film [g/cm$^3$] | density $\rho_2$ of low-acoustic-velocity film [g/cm$^3$] | average of densities $\rho_{ave}$ [g/cm$^3$] | density difference ratio $|\Delta\rho|/\rho_{ave} \times 100$ [%] | phase of higher-order mode [deg.] |
|---|---|---|---|---|---|
| comparative example | 2.30 | 2.30 | 2.30 | 0.00 | −66.4 |
| first preferred embodiment | 2.30 | 2.21 | 2.26 | 3.99 | −67.8 |
| | 2.30 | 2.12 | 2.21 | 8.14 | −69.2 |

As shown in Tables 1 to 3, a value of a phase of the higher-order mode in the first preferred embodiment is smaller than a value of a phase of the higher-order mode in the comparative example. That is, in the first preferred embodiment, an occurrence of a spurious mode outside a pass band is able to be significantly reduced or prevented.

As shown in Table 1, when the value of the density $\rho_1$ is fixed, the higher-order mode is significantly reduced more as the density difference ratio becomes higher. The same is true for the results shown in Tables 2 and 3. The density difference ratio is preferably about 1% or more, for example, and more preferably about 4% or more, for example. This density difference ratio is able to further significantly reduce or prevent the higher-order mode. Note that an upper limit of the density difference ratio is not limited in particular but is preferably, for example, about 8% or less.

As shown in FIG. 2, in the present preferred embodiment, the low-acoustic-velocity film 4 includes the first layer 4A and the second layer 4B. Note, however, that the low-acoustic-velocity film 4 may be a single-layer film. In a modification of the first preferred embodiment shown in FIG. 3, a low-acoustic-velocity film 24, which includes a single layer, includes a second portion B located closer to the high-acoustic-velocity support substrate 3 than a first portion A. A portion of the low-acoustic-velocity film 24 in which the first portion A is located and a portion of the low-acoustic-velocity film 24 in which the second portion B is located include the same or similar materials, and $\rho_1$ is preferably higher than $\rho_2$. In the low-acoustic-velocity film 24, the density $\rho_1$ and the density $\rho_2$ are different. More specifically, in the low-acoustic-velocity film 24, the density increases continuously or discretely from one point on the high-acoustic-velocity support substrate 3 side toward another point on the piezoelectric layer 5 side. Even in the modification of the first preferred embodiment, the higher-order mode is able to be significantly reduced or prevented in the first preferred embodiment.

A second preferred embodiment of the present invention is described in below with reference to FIG. 2. The second preferred embodiment is different from the first preferred embodiment in that the density $\rho_1$ is lower than the density $\rho_2$. Other features, elements, and components of an acoustic wave device according to the second preferred embodiment are similar to the acoustic wave device 1 according to the first preferred embodiment.

Also in the second preferred embodiment, the density $\rho_1$ and the density $\rho_2$ are different, and therefore an occurrence of a spurious mode outside a pass band is able to be significantly reduced or prevented. This is described below through comparison between the second preferred embodiment and a comparative example. The comparative example is different from the second preferred embodiment in that $\rho_1$ is equal or substantially equal to $\rho_2$.

Simulation was performed on a phase characteristic of a Rayleigh mode by setting the density $\rho_1$ and the density $\rho_2$ to be different in an acoustic wave device according to the second preferred embodiment. The Rayleigh mode occurs in a frequency band that is approximately 0.7 times higher than a pass band of the acoustic wave device. Simulation on a Rayleigh mode phase characteristic was also performed by an acoustic wave device according to the comparative example. Design parameters of the acoustic wave devices are as follows.

high-acoustic-velocity support substrate: material . . . Si
first layer of low-acoustic-velocity film: material . . . SiO$_2$, thickness . . . about 0.15 $\lambda$
second layer of low-acoustic-velocity film: material . . . SiO$_2$, thickness . . . about 0.15 $\lambda$
piezoelectric layer: material . . . LiTaO$_3$, thickness . . . about 0.3 $\lambda$
IDT electrode: material: Al, thickness . . . about 7% $\lambda$
wave length of IDT electrode: about 2 μm
duty of IDT electrode: about 0.5
dielectric film: material . . . SiO$_2$, thickness . . . about 2.5% $\lambda$ In the acoustic wave device according to the second preferred embodiment, the density $\rho_1$ of the low-acoustic-velocity film was changed within a range of not less than about 2.12 g/cm$^3$ and not more than about 2.30 g/cm$^3$, and the density $\rho_2$ was changed within a range of not less than about 2.12 g/cm$^3$ and not more than about 2.48 g/cm$^3$. In the comparative example, the density $\rho_1$ and the density $\rho_2$ of the low-acoustic-velocity film were changed within a range of not less than about 2.12 g/cm$^3$ and not more than about 2.30 g/cm$^3$.

Tables 4 to 6 show results of the second preferred embodiment and the comparative example. More specifically, Table 4 shows a result in a case where the density $\rho_1$ is about 2.21 g/cm$^3$. Table 5 shows a result in a case where the density $\rho_1$ is about 2.12 g/cm$^3$. Table 6 shows a result in a case where the density $\rho_1$ is about 2.30 g/cm$^3$.

TABLE 4

|  | density $\rho_1$ of low-acoustic-velocity film [g/cm$^3$] | density $\rho_2$ of low-acoustic-velocity film [g/cm$^3$] | average of densities $\rho_{ave}$ [g/cm$^3$] | density difference ratio $|\Delta\rho|/\rho_{ave} \times$ 100 [%] | phase of Rayleigh mode [deg.] |
|---|---|---|---|---|---|
| comparative example | 2.21 | 2.21 | 2.21 | 0.00 | −73.1 |
| second preferred embodiment | 2.21 | 2.25 | 2.23 | 1.79 | −73.3 |
|  | 2.21 | 2.34 | 2.28 | 5.71 | −74.1 |

TABLE 5

|  | density $\rho_1$ of low-acoustic-velocity film [g/cm$^3$] | density $\rho_2$ of low-acoustic-velocity film [g/cm$^3$] | average of densities $\rho_{ave}$ [g/cm$^3$] | density difference ratio $|\Delta\rho|/\rho_{ave} \times$ 100 [%] | phase of Rayleigh mode [deg.] |
|---|---|---|---|---|---|
| comparative example | 2.12 | 2.12 | 2.12 | 0.00 | −72.5 |
| second preferred embodiment | 2.12 | 2.21 | 2.17 | 4.16 | −73.1 |
|  | 2.12 | 2.30 | 2.21 | 8.14 | −73.8 |

TABLE 6

|  | density $\rho_1$ of low-acoustic-velocity film [g/cm$^3$] | density $\rho_2$ of low-acoustic-velocity film [g/cm$^3$] | average of densities $\rho_{ave}$ [g/cm$^3$] | density difference ratio $|\Delta\rho|/\rho_{ave} \times$ 100 [%] | phase of Rayleigh mode [deg.] |
|---|---|---|---|---|---|
| comparative example | 2.30 | 2.30 | 2.30 | 0.00 | −73.5 |
| second preferred embodiment | 2.30 | 2.39 | 2.35 | 3.84 | −74.2 |
|  | 2.30 | 2.48 | 2.39 | 7.53 | −74.7 |

As shown in Tables 4 to 6, a value of a phase of the Rayleigh mode in the second preferred embodiment is smaller than a value of a phase of the Rayleigh mode in the comparative example. That is, in the second preferred embodiment, an occurrence of a spurious mode outside a pass band is able to be significantly reduced or prevented.

As shown in Tables 4 to 6, in a case where the value of the density ρ1 is fixed, the Rayleigh mode is further significantly reduced as the density difference ratio becomes higher. The density difference ratio is preferably about 1% or more, for example, and more preferably about 4% or more, for example. This density difference ratio is able to further significantly reduce or prevent the Rayleigh mode. An upper limit of the density difference ratio is not limited in particular but is preferably, for example, about 8% or less.

Figure 3:
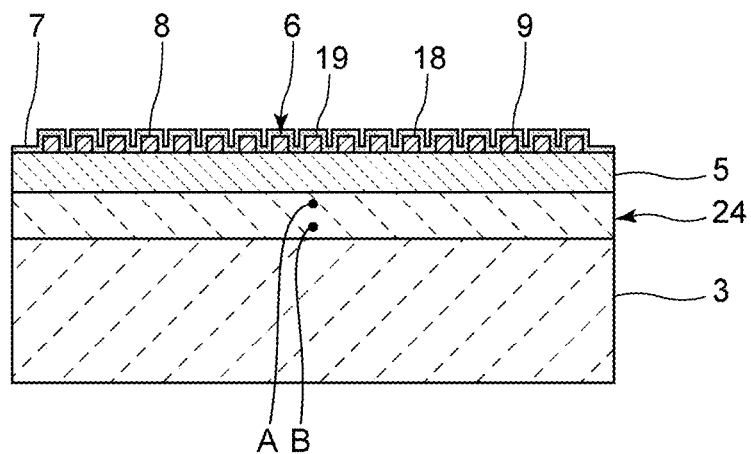
FIG. 3 is a front cross-sectional view of an acoustic wave device according to a modification of the first preferred embodiment of the present invention.

Although the low-acoustic-velocity film 24 is a single-layer film in the modification of the first preferred embodiment shown in FIG. 3, the low-acoustic-velocity film may be a single-layer film even in a case where ρ1 is lower than ρ2 as in the second preferred embodiment. A modification of the second preferred embodiment is described below with reference to FIG. 3. In the present modification, the low-acoustic-velocity film 24 includes a single layer. A portion of the low-acoustic-velocity film 24 in which the first portion A is located and a portion of the low-acoustic-velocity film 24 in which the second portion B is located include the same or similar materials, and ρ1 is preferably lower than ρ2. In the low-acoustic-velocity film 24, the density decreases continuously or discretely from one point on the high-acoustic-velocity support substrate 3 side toward another point on the piezoelectric layer 5 side. Even in the modification of the second preferred embodiment, the Rayleigh mode is able to be significantly reduced or prevented as in the second preferred embodiment.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
a high-acoustic-velocity support substrate;
a low-acoustic-velocity film provided on the high-acoustic-velocity support substrate;
a piezoelectric layer provided on the low-acoustic-velocity film; and
an interdigital transducer (IDT) electrode provided on the piezoelectric layer; wherein
an acoustic velocity of a bulk wave propagating through the high-acoustic-velocity support substrate is higher than an acoustic velocity of an acoustic wave propagating through the piezoelectric layer;
an acoustic velocity of a bulk wave propagating through the low-acoustic-velocity film is lower than the acoustic velocity of a bulk wave propagating through the piezoelectric layer;
the low-acoustic-velocity film includes a first portion and a second portion that is located closer to the high-acoustic-velocity support substrate than the first portion;
the first portion includes same or substantially same materials as materials included in the second portion; and
$\rho_1$ and $\rho_2$ are different, where $\rho_1$ is a density of the first portion of the low-acoustic-velocity film and $\rho_2$ is a density of the second portion of the low-acoustic-velocity film.

2. The acoustic wave device according to claim 1, wherein the low-acoustic-velocity film includes a first layer and a second layer;
the second layer is located closer to the high-acoustic-velocity support substrate than the first layer and has a density different from a density of the first layer; and
the first portion is located in the first layer, and the second portion is located in the second layer.

3. The acoustic wave device according to claim 1, wherein the low-acoustic-velocity film is a single-layer film; and the low-acoustic-velocity film has a density gradient from $\rho_1$ and $\rho_2$, which are different from each other.

4. The acoustic wave device according to claim 1, wherein $\rho_1$ is higher than $\rho_2$.

5. The acoustic wave device according to claim 1, wherein $\rho_1$ is lower than $\rho_2$.

6. The acoustic wave device according to claim 1, wherein a density difference ratio, which is expressed by $|\Delta\rho|/\rho_{ave} \times 100(\%)$, is about 1% or more, where $|\Delta\rho|$ is an absolute value of a difference between $\rho_1$ and $\rho_2$ and an average of $\rho_1$ and $\rho_2$ is $\rho_{ave}$.

7. The acoustic wave device according to claim 1, wherein the low-acoustic-velocity film is a silicon oxide film.

8. The acoustic wave device according to claim 1, wherein the acoustic wave device is an acoustic wave resonator.

9. The acoustic wave device according to claim 1, wherein the piezoelectric layer is a lithium tantalate layer.

10. The acoustic wave device according to claim 1, further comprising a dielectric film that covers the IDT electrode.

11. The acoustic wave device according to claim 10, wherein the dielectric film is a silicon oxide film.

12. The acoustic wave device according to claim 1, wherein the IDT electrode includes a plurality of first electrode fingers connected to a first busbar, and a plurality of second electrode fingers connected to a second busbar.

13. The acoustic wave device according to claim 6, wherein the density difference ratio is between about 4% and about 8%.

* * * * *